(12) United States Patent
Ramachandran et al.

(10) Patent No.: US 8,368,226 B2
(45) Date of Patent: Feb. 5, 2013

(54) DIE POWER STRUCTURE

(75) Inventors: Aparna Ramachandran, Cupertino, CA (US); Gary John Formica, San Jose, CA (US)

(73) Assignee: Oracle International Corporation, Redwood City, CA (US)

( * ) Notice: Subject to any disclaimer, the term of this patent is extended or adjusted under 35 U.S.C. 154(b) by 0 days.

(21) Appl. No.: 13/412,513

(22) Filed: Mar. 5, 2012

(65) Prior Publication Data
US 2012/0161856 A1 Jun. 28, 2012

Related U.S. Application Data

(63) Continuation-in-part of application No. 12/646,806, filed on Dec. 23, 2009, now Pat. No. 8,269,333.

(51) Int. Cl.
G11C 5/14 (2006.01)
H01L 21/768 (2006.01)
H01L 23/485 (2006.01)

(52) U.S. Cl. ........ 257/773; 257/750; 257/776; 257/786; 257/E23.019; 257/E23.021

(58) Field of Classification Search .................. 257/750, 257/773, 776, 786, E23.019, E23.021; 327/530
See application file for complete search history.

(56) References Cited

U.S. PATENT DOCUMENTS
2001/0047588 A1   12/2001   Schaper

Primary Examiner — Peniel M Gumedzoe
(74) Attorney, Agent, or Firm — Osha Liang LLP

(57) ABSTRACT

A die including a first set of power tiles arranged in a first array and having a first voltage; a second set of power tiles arranged in a second array offset from the first array and having a second voltage; a set of power mesh segments enclosed by the second set of power tiles and having the first voltage; a first power rail passing underneath the set of power mesh segments and the first set of power tiles; and a set of vias operatively connecting the power rail with the set of power mesh segments and the first plurality of power tiles.

9 Claims, 7 Drawing Sheets

DIE POWER STRUCTURE

CROSS-REFERENCE TO RELATED APPLICATIONS

The present application is a continuation-in-part (CIP) of U.S. patent application Ser. No. 12/646,806, filed on Dec. 23, 2009, and entitled: "Combined Power Mesh Transition and Signal Overpass/Underpass". Accordingly, the present application claims benefit of U.S. patent application Ser. No. 12/646,806 under 35 U.S.C. §120. U.S. patent application Ser. No. 12/646,806 is hereby incorporated by reference in its entirety.

BACKGROUND

The quality of the distribution of power within a semiconductor device impacts the performance of the semiconductor device in terms of frequency and power. The frequency of the semiconductor device is determined by the worst case transient droop seen by a circuit when it switches. The active power dissipation is determined by the square of the voltage that the circuit recovers to after the switching has stopped.

SUMMARY

In general, in one aspect, the invention relates to a die. The die comprises: a first plurality of power tiles arranged in a first array and having a first voltage; a second plurality of power tiles arranged in a second array offset from the first array and having a second voltage; a first plurality of power mesh segments enclosed by the second plurality of power tiles and having the first voltage; a first power rail passing underneath the first plurality of power mesh segments and the first plurality of power tiles; and a first plurality of vias operatively connecting the first power rail with the first plurality of power mesh segments and the first plurality of power tiles.

In general, in one aspect, the invention relates to a method of operating a die. The method comprises: comprising: distributing a first power signal having a first voltage across a first plurality of power tiles arranged in a first array and a first plurality of mesh segments; distributing a second power signal having a second voltage across a second plurality of power tiles arranged in a second array and a second plurality of mesh segments, wherein the first plurality of power tiles encloses the second plurality of mesh segments, wherein the second plurality of power tiles encloses the first plurality of mesh segments, and wherein the first array and the second array are offset on the die; and propagating the first power signal to a first power rail operatively connected to the first plurality of power tiles and the first plurality of mesh segments by a first plurality of vias.

In general, in one aspect, the invention relates to a method of manufacturing a die. The method comprises: generating a M12 layer of the die comprising a first plurality of power tiles arranged in a first array, a second plurality of power tiles arranged in a second array offset from the first array, and a first plurality of mesh segments enclosed by the second plurality of power tiles; generating a M13 layer of the die comprising a first bump and a full-dense-mesh (FDM) operatively connected to the first plurality of mesh segments by a first plurality of vias; and generating a M11 layer of the die comprising a first power rail operatively connected to the first plurality of power tiles and the first plurality of mesh segments by a second plurality of vias, wherein the first plurality of power tiles, the first plurality of mesh segments, the first power rail, and the first bump are configured to have a first voltage, and wherein the second plurality of tiles are configured to have a second voltage.

Other aspects of the invention will be apparent from the following description and the appended claims.

DETAILED DESCRIPTION

Figure 1:
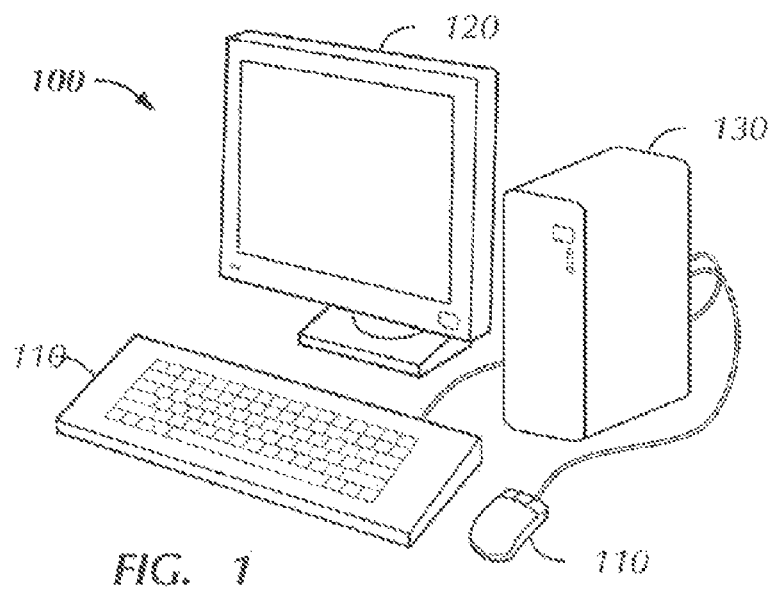
FIG. 1 shows a computer system in accordance with one or more embodiments of the invention.

Specific embodiments of the invention will now be described in detail with reference to the accompanying figures. Like elements in the various figures are denoted by like reference numerals for consistency.

In the following detailed description of embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

In general, embodiments of the invention provide a die, a method for operating the die, and/or a method for manufacturing the die. Specifically, the die includes at least a M13 (i.e., top) layer, a M12 (i.e., top-1) layer, and an M11 (i.e. top-2) layer. The M12 layer has VDD power tiles arranged in an array and enclosing VSS mesh segments. The M12 layer also has VSS power tiles arranged in an array and enclosing VDD mesh segments. The two arrays are offset and separated by a zipper structure which cuts across the M13 and M12 layers. The M11 may have at least one VDD power rail that passes underneath some of the VDD power tiles and some of the VDD mesh segments. The M11 may also have at least one VSS power rail that passes underneath some of the VSS power tiles and some of the VSS mesh segments. This configuration allows for additional vias to operatively connect the power rails of the M11 layer with the power tiles and mesh segments of the M12 layer, resulting in a reduced vertical resistance in the die's power structure.

FIG. 1 shows a computer system (100) in accordance with one or more embodiments of the invention. The computer system (100) includes input devices (110), an output device (120), and a mechanical chassis (130). The mechanical chassis (130) includes a printed circuit board (PCB), a network device, and a storage device (not shown). The computer system (100) may correspond to a desktop personal computer (PC), a laptop, a server, a mainframe, a smart phone, a kiosk, a personal digital assistant (PDA), a printer, a cable box, or any other hardware device.

Figure 2:
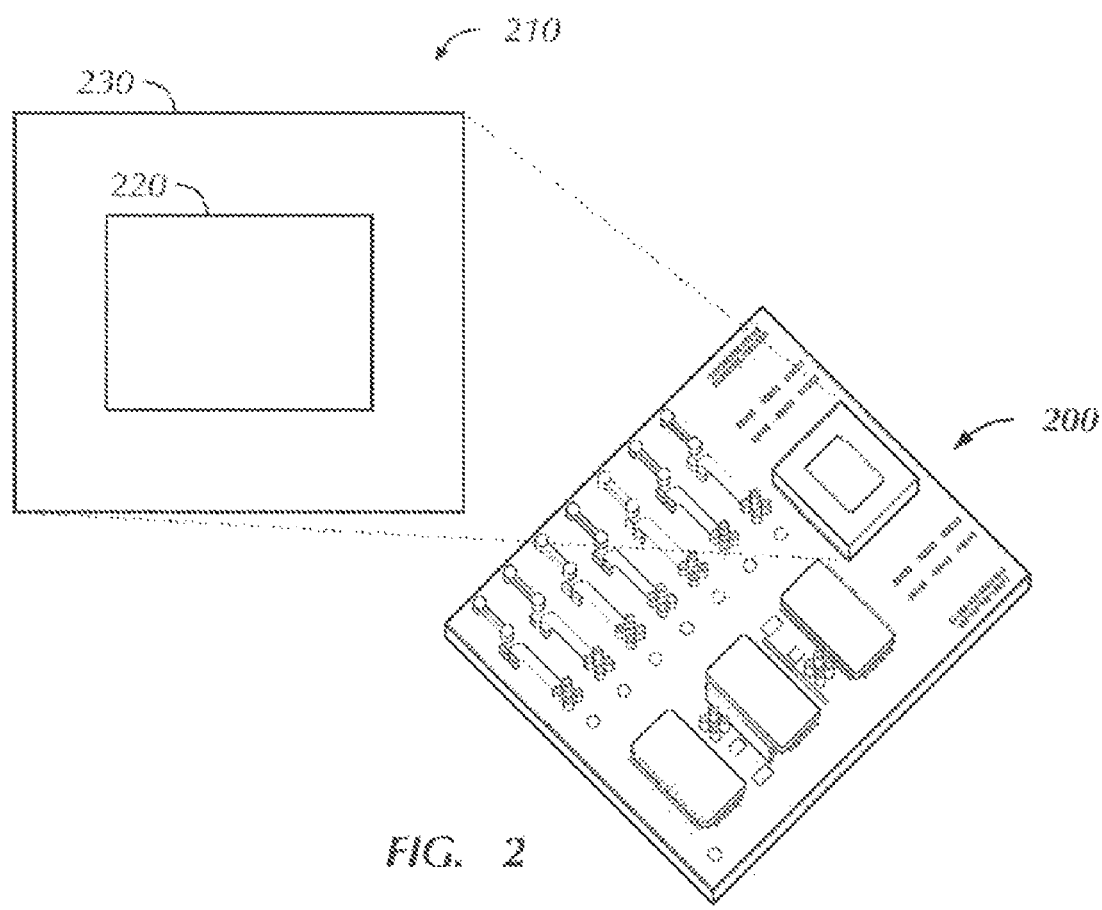
FIG. 2 shows a printed circuit board (PCB) in accordance with one or more embodiments of the invention.

FIG. 2 shows a PCB (200) in accordance with one or more embodiments of the invention. The PCB (200) may be included in the system (100), discussed above in reference to FIG. 1. The PCB (200) has one or more semiconductor devices (e.g., semiconductor device (210)). Moreover, the semiconductor device (210) includes one or more semiconductor die (220) encapsulated in a mechanical package (230). The mechanical package (230) serves as an electrical and mechanical interface between the die (220) and the PCB (200).

In one or more embodiments of the invention, the PCB (200) provides one or more external signals to the semiconductor device (210). The mechanical package (230) provides the external signals to the die (220). The die (220) is comprised of a plurality of metal layers and a semiconductor layer. The die (220) generates one or more internal signals that are a function of the provided external signals.

Figure 3:
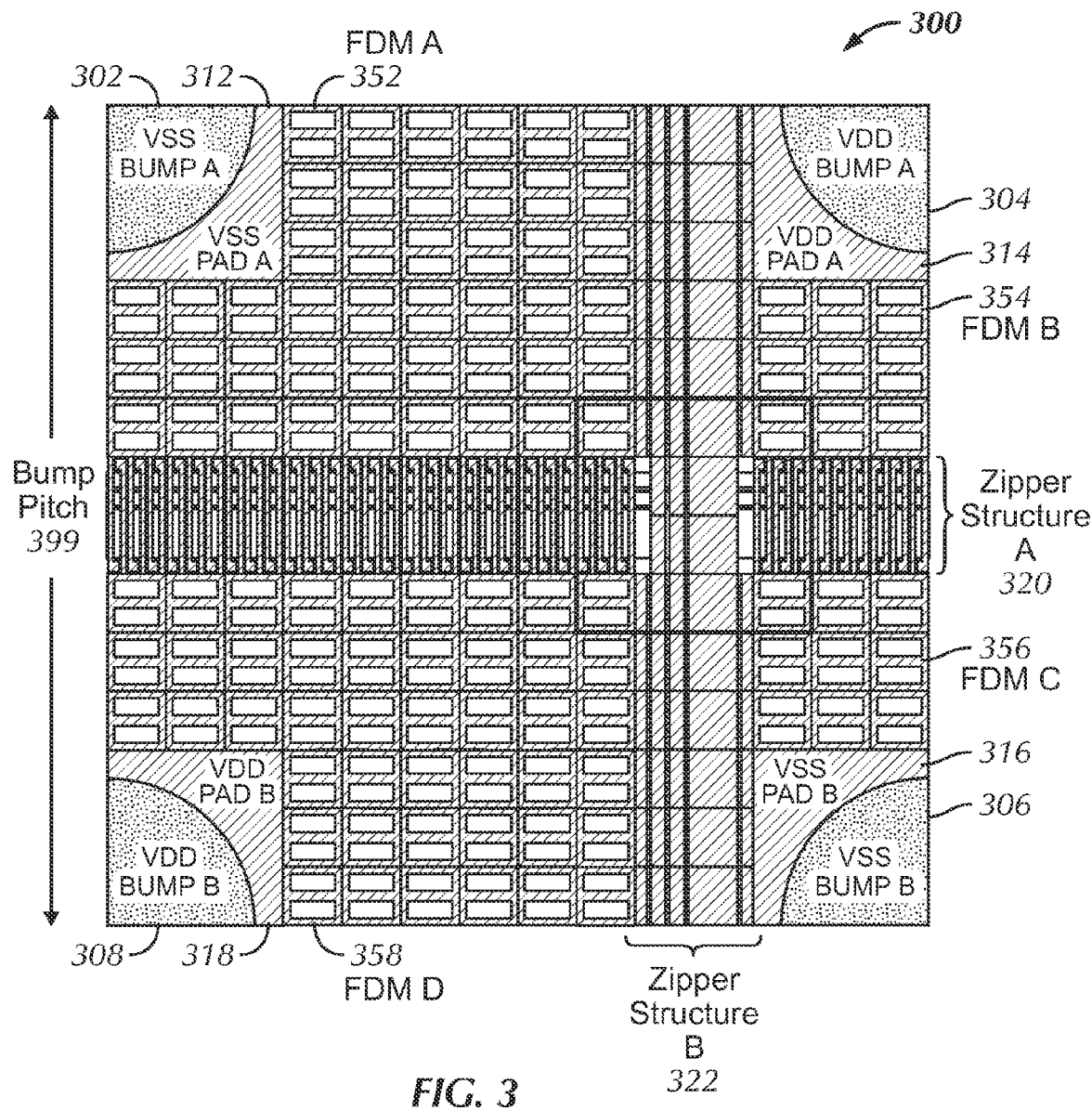
FIG. 3 shows the top layer of a die in accordance with one or more embodiments of the invention.

FIG. 3 shows a portion of the top layer (i.e., M13 layer) (300) of the die (220) in accordance with one or more embodiment. As shown in FIG. 3, the top layer (300) is partitioned into multiple regions by one or more zipper structures (e.g., zipper structure A (320), zipper structure B (322)). The zipper structures (320, 322) may cut across the top and top-1 (i.e., M13 and M12) layers of the die (220). Each region includes a bump (e.g., VSS Bump A (302), VDD Bump A (304), VSS Bump B (306), VDD Bump B (308)), a full-dense-mesh (FDM) (e.g., FDM A (352), FDM B (354), FDM C (356), FDM D (358)), and a pad (e.g., VSS Pad A (312), VDD Pad A (314), VSS Pad B (316), VDD Pad B (318)) operatively connecting the bump (302, 304, 306, 308) with the corresponding FDM (352, 354, 356, 358). Those skilled in the art, having the benefit of this detailed description, will appreciate that the bumps (302, 304, 306, 308), pads (312, 314, 316, 318), and FDMs (352, 354, 356, 358) are part of the die's power structure and responsible for distributing VDD and VSS power signals to/from components attached to the bumps (302, 304, 306, 308). In one or more embodiments of the invention, the bumps (302, 304, 306, 308), pads (312, 314, 316, 318), and the FDMs (352, 354, 356, 358) are composed primarily of aluminum or aluminum alloys.

Still referring to FIG. 3, the VDD bumps (304, 308) and VSS bumps (302, 306) are alternately stacked in offset columns and rows. Moreover, the distance between the bumps in a row or column is referred to as the bump pitch (399). In each region, the voltage polarity of the pad and the FDM matches the voltage polarity of the corresponding bump. Accordingly, FDM A (352) and FDM C (356) are VSS, while FDM B (354) and FDM D (358) are VDD.

In one or more embodiments of the invention, FDM A (352), FDM B (354), FDM C (356), and FDM D (358) may be considered a single FDM with breaks created by the zipper structure(s) (320, 322). The zipper structures (320, 322) may carry/propagate additional signals (e.g., clock signals, auxiliary power signals, etc.) (not shown). In one or more embodiments of the invention, the zipper structures (320, 322) are the same as the zipper structures described in U.S. patent application Ser. No. 12/646,806, filed on Dec. 23, 2009, and entitled: "Combined Power Mesh Transition and Signal Overpass/Underpass". As mentioned above, U.S. patent application Ser. No. 12/646,806 is incorporated by reference in its entirety.

Figure 4A:
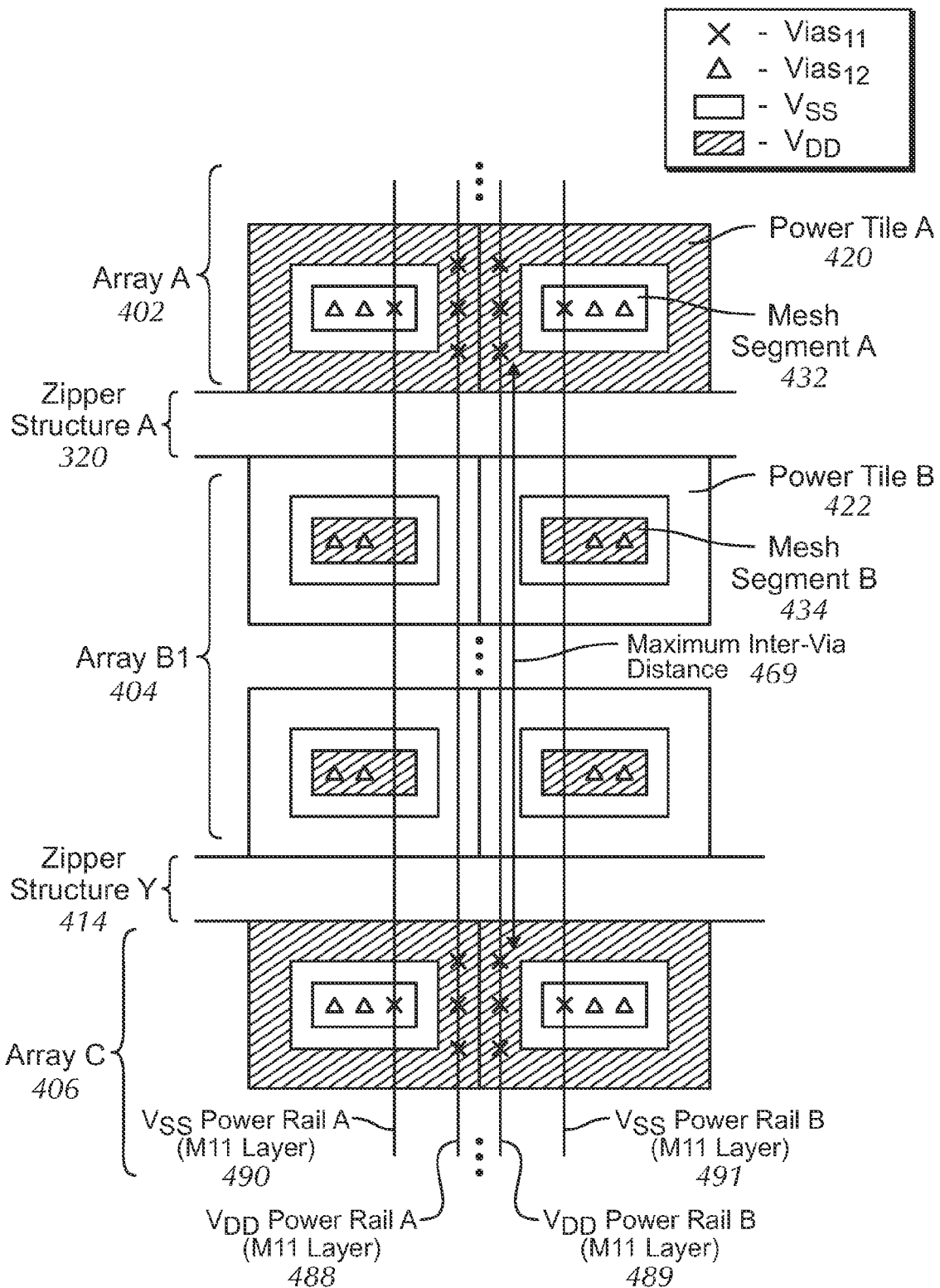
FIG. 4A and FIG. 4B show the top-1 and top-2 layers of the die in accordance with one or more embodiments of the invention.

FIG. 4A shows a portion of the top-1 layer (i.e., M12 layer) and the top-2 (i.e., M11 layer) of the die (220) in accordance with one or more embodiments of the invention. As shown in FIG. 4A, the top-1 layer (i.e., M12 layer) of the die (220) is partitioned into multiple regions separated by one or more zipper structures (i.e., Zipper Structure A (320), Zipper Structure Y (414)). As discussed above, the zipper structures (320, 414) cut through both the top and top-1 (i.e., M13 and M12) layers of the die (220). As also shown in FIG. 4A, each region includes an array (e.g., Array A (402), Array B1 (404), Array C (406)) having multiple power tiles enclosing multiple mesh segments. In other words, the multiple power tiles and multiple mesh segments are arranged in arrays. In one or more embodiments of the invention, the arrays are composed primarily of copper or copper alloys.

In one or more embodiments of the invention, all the power tiles in an array are of the same voltage polarity, while all the mesh segments in the array are of a different voltage polarity. Further, the voltage polarity of the mesh segments matches the voltage polarity of the FDM in the layer above the array (i.e., FDM in the top layer). Further still, there exists vias (i.e., vertical interlayer connections) operatively connecting the mesh segments with the FDM in the layer above the array.

For example, array A (402) includes power tile A (420) and mesh segment A (432). All power tiles in array A (402), including power tile A (420), have VDD polarity. All mesh segments in array A (402), including mesh segment A (432), have VSS polarity. Further, array A (402) is below FDM A (352) in the top layer, discussed above in reference to FIG. 3, and thus the mesh segments of array A (402) have the same voltage polarity as FDM A (352): VSS. Further still, as shown in FIG. 4A, there exists vias (VIAS$_{12}$) operatively connecting the mesh segments of array A (402) with FDM A (352).

Figure 4B:
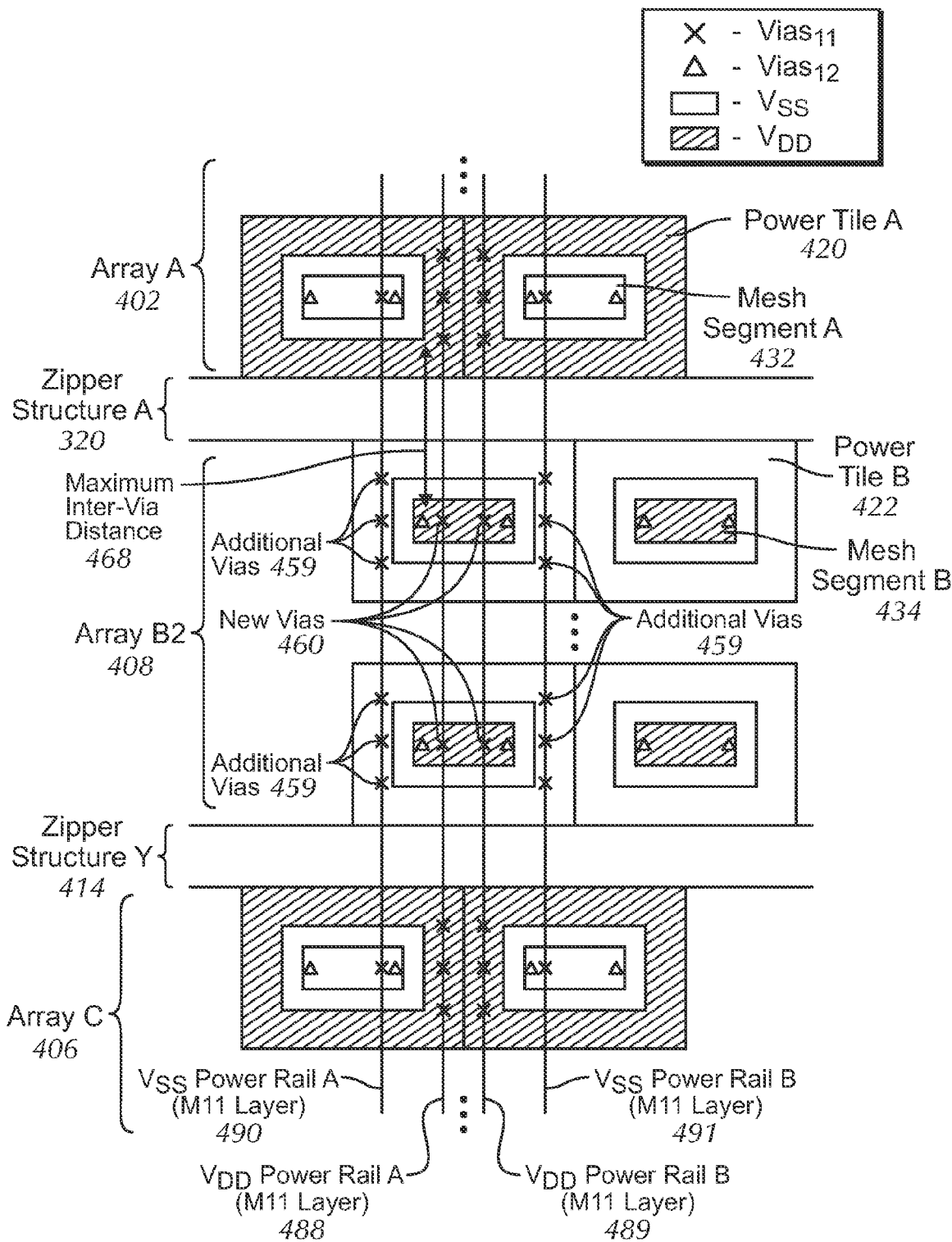

As yet another example, array B1 (404) includes power tile B (422) and mesh segment B (434). All power tiles in array B1 (404), including power tile B (422), have VSS polarity. All mesh segments in array B1 (404), including mesh segment B1 (434), have VDD polarity. Further, array B1 (404) is below FDM D (358) in the top layer, discussed above in reference to FIG. 3, and thus the mesh segments of array B1 (404) have the same voltage polarity as FDM D (358): VDD. Further still, as shown in FIG. 4B, there exists vias (VIAS$_{12}$) operatively connecting the mesh segments of array B1 (404) with FDM D (358).

In one or more embodiments of the invention, zipper structure A (320) operatively connects the power tiles of array A (402) and array B (404) with the FDM of the same voltage polarity in the top layer. In other words, zipper structure A (320) operatively connects the power tiles of array A (402) with FDM D (358), discussed above in reference to FIG. 3. Both the power tiles of array A (402) and FDM D (358) have the same voltage polarity: VDD. Similarly, zipper structure A (320) also operatively connects the power tiles of array B (404) with FDM A (352). Both the power tiles of array B (404) and FDM A (352) have the same voltage polarity: VSS.

Still referring to FIG. 4A, there exists one or more power rails (e.g., VDD Power Rail A (488), VDD Power Rail B (489), VSS Power Rail A (490), VSS Power Rail B (491)) passing underneath the arrays (402, 404, 406). In other words, the power rails (488, 489, 490, 491) are part of the top-2 layer (i.e., M11 layer) located beneath the top-1 layer (i.e., M12 layer).

As shown in FIG. 4A, there exists vias (VIAS$_1$) operatively connecting some power tiles of array A (402) with VDD power rail A (488) and VDD power rail B (489), and there exists vias (VIAS$_{11}$) operatively connecting some power tiles of array C (406) with VDD power rail A (488) and VDD power rail B (489).

As also shown in FIG. 4A, there exists vias (VIAS$_1$) operatively connecting some mesh segments of array A (402) with VSS power rail A (490) and VSS power rail B (491), and there exists some vias (VIAS$_{11}$) operatively connecting the mesh segments of array C (406) with VSS power rail A (490) and VSS power rail B (491).

However, still referring to FIG. 4A, there are no vias connecting the VDD power rails (488, 489) with array B1 (404).

Although, as shown in FIG. 4A, the VDD power rails (488, 489) do pass underneath array B1 (404), the VDD power rails (488, 489) pass underneath the power tiles of array B1 (404), which have a different voltage polarity (i.e., VSS) than the VDD power rails (488, 489). As a result, the maximum inter-via distance (469) among the vias operatively connecting the VDD power rails (488, 489) to the top-1 layer (i.e., M12 layer) equals or exceeds the bump pitch (e.g., bump pitch (399), discussed above in reference to FIG. 3).

FIG. 4B shows a portion of the top-1 layer (i.e., M12 layer) and the top-2 (i.e., M11 layer) of the die (220) in accordance with one or more embodiments of the invention. FIG. 4B is similar to FIG. 4A. In other words, the top-1 layer (i.e., M12 layer) of the die is partitioned into multiple regions separated by one or more zipper structures (i.e., Zipper Structure A (320), Zipper Structure Y (414)). Further, each region includes an array (e.g., Array A (402), Array B2 (408), Array C (406)) having multiple power tiles enclosing multiple mesh segments. Further still, the top-2 layer (i.e., M11) layer includes multiple power rails (488, 489, 490, 491) operatively connected to some of the power tiles and the mesh segments in the top-1 layer (i.e., M12 layer) by vias.

Array B2 (408) is similar to array B1 (404), discussed above in reference to FIG. 4A. However, as shown in FIG. 4B and unlike FIG. 4A, array B2 (408) is offset from array A (402). Array B2 (408) is also offset from array C (406). In other words, the borders (i.e., edges) of the power tiles and/or mesh segments in array A (402) and array C (406) do not line up with the borders (i.e., edges) of the power tiles/mesh segments in array B2 (408). This is in contrast to FIG. 4A, where the borders (i.e., edges) of the power tiles/mesh segments in all arrays (i.e., array A (402), array B1 (404), array C (406)) were aligned.

Still referring to FIG. 4B, because of the offset, it is now possible to connect the VDD power rails (488, 489) to array B2 (408). In other words, there now exists vias (460) connecting the VDD power rails (488, 489) to array B2 (408). These new vias (460), made possible by the offset, reduce the maximum inter-via distance (468) among the vias to a value less than the bump pitch (e.g., tile pitch). Further, because of the offset, additional vias (459) may be used to connect the VSS power rails (490, 491) to array B2 (408). These new vias (460) and/or additional vias (459) decrease the distance any signal must travel on the power rails, effectively reducing the overall resistance between the top-1 layer and the top-2 layer (i.e., M12 layer and M11 layer).

Although FIG. 4B shows the arrays (402, 406, 408) as vertically arranged and the power rails (488, 489, 490, 491) as being vertical straight lines, those skilled in the art, having the benefit of this detailed description, will appreciate that the arrays (402, 406, 408) may be horizontally arranged with the power rails (488, 489, 490, 491) being horizontal straight lines. Moreover, there may be more power rails than the number of power rails shown in FIG. 4B.

Further, although FIG. 4B shows array A (402) and array C (406) having VDD power tiles, while array B2 (408) has VSS power tiles, those skilled in the art, having the benefit of this detailed description, will appreciate that array B2 (408) may have VDD power tiles, and array A (402) and array C (406) may have VSS power tiles. In such embodiments of the inventions, the voltage polarities of the power rails (488, 489, 490, 491) would need to reverse (i.e., VSS to VDD and VDD to VSS) to accommodate the voltage polarity of the power tiles in the arrays (402, 404, 408).

Figure 5:
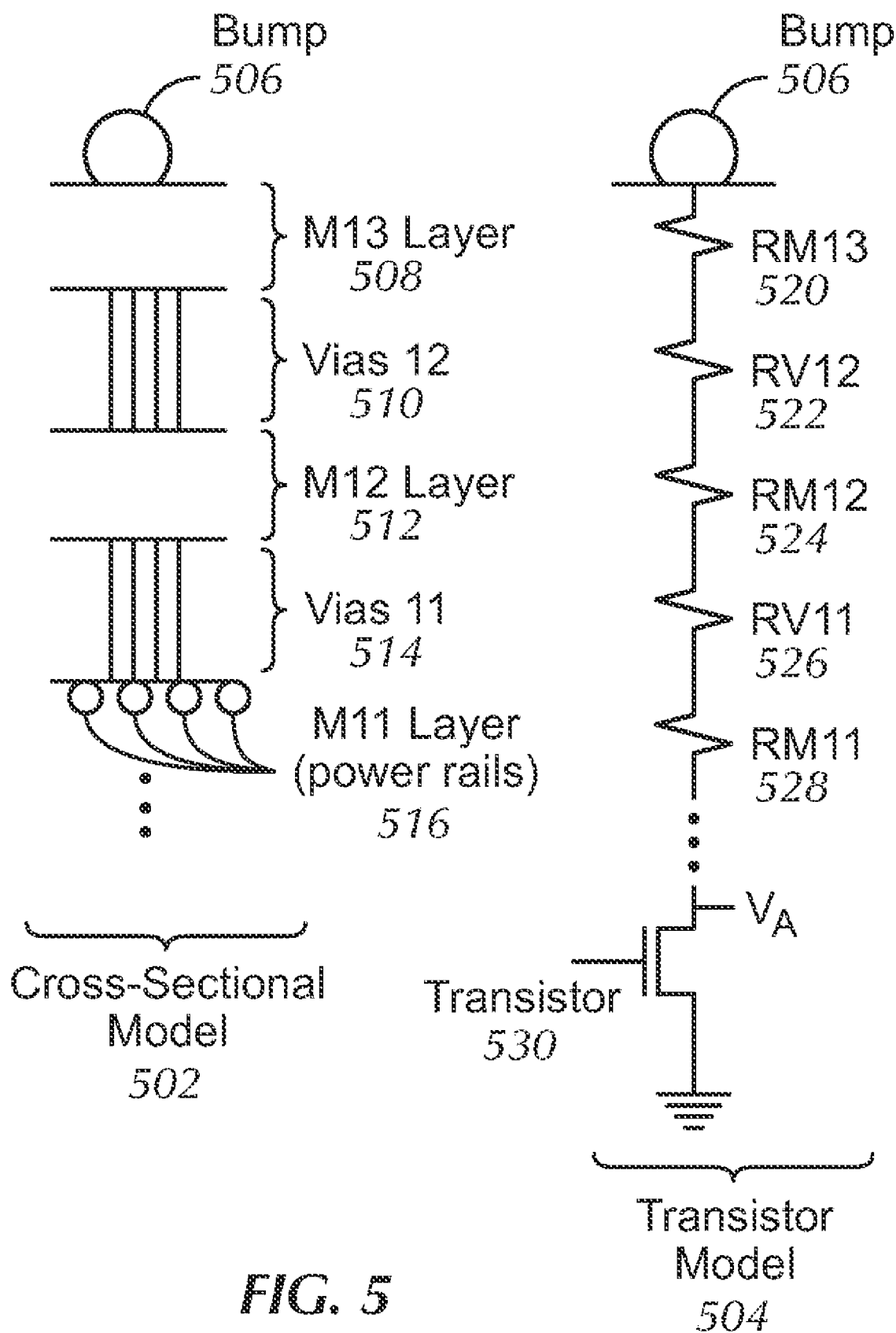
FIG. 5 shows a cross-sectional model and a transistor model of the die in accordance with one or more embodiments of the invention.

FIG. 5 shows a cross-sectional model (502) of the die and a transistor model (504) of the die in accordance with one or more embodiments of the invention. Those skilled in the art, having the benefit of this detailed description, will appreciate that other cross-sectional models and transistor models for the die exist.

As shown in FIG. 5, the cross-sectional model (502) includes a bump (506), the M13 layer (508), the M12 layer (512), and the M11 layer (516). The cross-sectional model (502) also shows multiple vias (i.e., V12 (510)) connecting the M13 layer and the M12 layer, and multiple vias (i.e., V11 (514)) connecting the M11 layer and the M12 layer.

As also shown in FIG. 5, the transistor model (504) includes a transistor (530), the bump (506), and multiple resistors (i.e., RM13 (520), RM12 (524), RM11 (528)) representing the resistances of the various layers. Further, the transistor model (504) also includes multiple resistors (i.e., RV12 (522), RV11 (526)) representing the resistances of the vias connecting the layers.

As discussed above, by offsetting the arrays in the M12 layer, it becomes possible to increase the number of vias connecting the M12 layer and the M11 layer (i.e., power rails), and decrease the maximum inter-via distance to a value less than the bump pitch. This corresponds to reducing the distance current must travel on the M11 layer (i.e., power rails), which is beneficial since RM12<RM11. Moreover, this reduces the overall resistance between M12 and M11, and helps ensure the voltage at the terminal of the transistor (530) (i.e., $V_A$) will be sufficiently large for the transistor (and thus die) to operate correctly.

Figure 6:
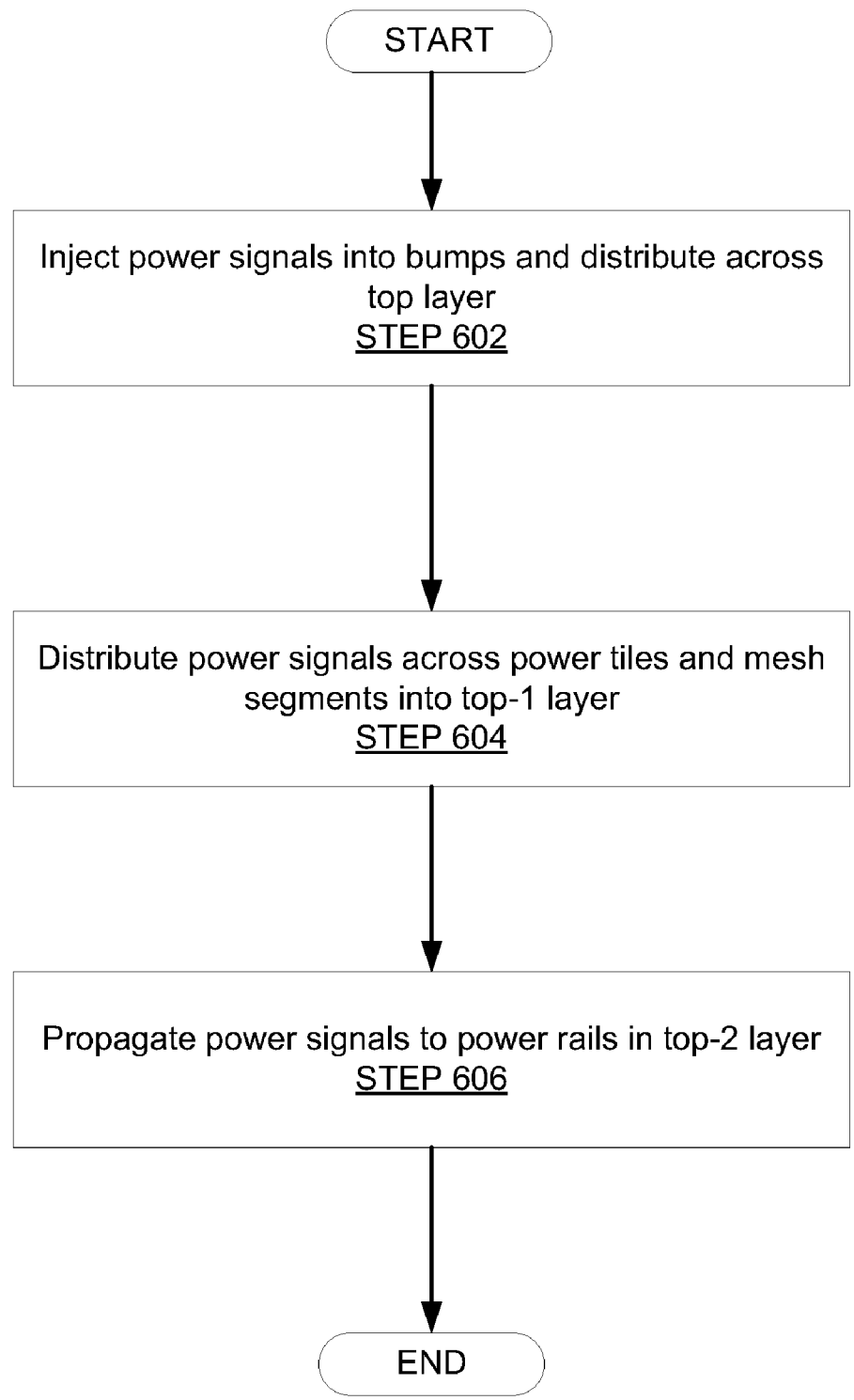
FIG. 6 and FIG. 7 show flowcharts in accordance with one or more embodiments of the invention.

FIG. 6 shows a flowchart in accordance with one or more embodiments of the invention. The process shown in FIG. 6 may be used to operate a die (i.e., the die shown in any of FIGS. 1-5). One or more steps in FIG. 6 may be repeated, omitted, and/or performed in a different order. One or more steps in FIG. 6 may be performed in parallel.

Initially, VDD power signals and VSS power signals are injected into the bumps of the die and distributed by the corresponding FDM (STEP 602). As discussed above, the top layer (i.e., M13 layer) may have multiple regions caused by zipper structures, and each region includes a bump, a FDM, and a pad operatively connecting the bump and the FDM. It is the FDMs that distribute each power signal injected at the bump to the rest of their respective region.

In STEP 604, the VDD power signals and VSS power signals are distributed across power tiles and mesh segments in the top-1 (i.e., M12) layer of the die. As discussed above, the M12 layer includes both VDD and VSS power tiles that are connected to the FDMs of the M13 layer by the zipper structures. In other words, the power tiles receive the VDD or VSS power signals from the M13 layer via the zipper structures. As also discussed above, the M12 layer includes both VDD and VSS mesh segments that are connected to the FDMs of the M13 layer by vias. In other words, the mesh segments receive the VSS or VDD power signals from the vias.

Within the M12 layer, the VDD power tiles enclose VSS mesh segments, while the VSS power tiles enclose VDD mesh segments. Further, the power tiles and mesh segments are arranged in arrays separated by the zipper structures. Further still, adjacent arrays may be offset with respect to each other so that the borders (i.e., edges) of the power tiles in the adjacent arrays do not align.

In STEP 606, the VDD and VSS power signals are propagated to the power rails of the top-2 layer (i.e., M11 layer). As discussed above, VSS power rails and VDD power rails pass underneath the power tiles and mesh segments. Connections between the power rails and the M12 layer are achieved by vias. In other words, the VDD and VSS power signals are propagated to their respective power rails by the vias. As the arrays in the M12 layer are offset, the maximum inter-via distance is a value less than the bump pitch. This reduces the distance the VDD and VSS signals must travel on the power rails before propagating to lower levels (M10, M9, . . . ) of the die.

Figure 7:
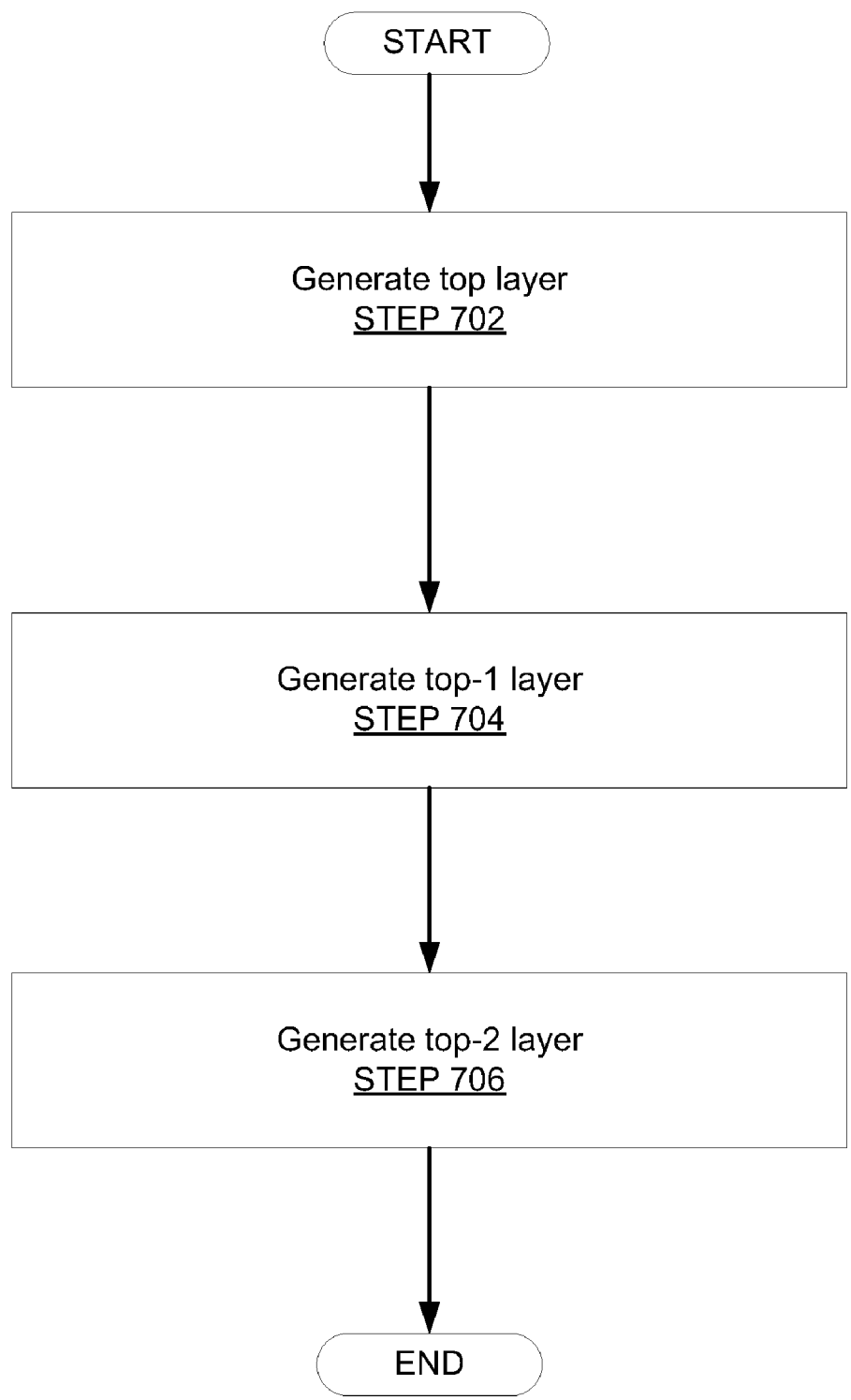

FIG. 7 shows a flowchart in accordance with one or more embodiments of the invention. The process shown in FIG. 7 may be used to operate a die (i.e., the die shown in any of FIGS. 1-5). One or more steps in FIG. 7 may be repeated, omitted, and/or performed in a different order. One or more steps in FIG. 7 may be performed in parallel.

Initially, the top layer (i.e. M13 layer) of the die is generated (STEP 702). As discussed above, the top layer has multiple regions created by zipper structures. Each region includes a bump, a pad, and a FDM. The bump, the pad, and the FDM are configured to have the same voltage polarity (i.e., VDD or VSS).

In STEP 704, the top-1 layer (i.e., M12 layer) of the die is generated. The top-1 layer includes both VDD and VSS power tiles that are connected to the FDMs of the M13 layer by the zipper structures. As also discussed above, the M12 layer includes both VDD and VSS mesh segments that are connected to the FDMs of the M13 layer by vias. Within the M12 layer, the VDD power tiles enclose VSS mesh segments, while the VSS power tiles enclose VDD mesh segments. Further, the power tiles and mesh segments are arranged in arrays separated by the zipper structures. Further still, adjacent arrays may be offset with respect to each other so that the borders (i.e., edges) of the power tiles in the adjacent arrays do not align.

In STEP 706, the top-2 layer (i.e., M11 layer) of the die is generated. The top-2 layer includes both VSS and VDD power rails. As discussed above, the VSS power rails and VDD power rails pass underneath the power tiles and mesh segments of the top-1 layers. Connections between the power rails and the M12 layer are achieved by vias. As the arrays in the M12 layer are offset, the maximum inter-via distance is a value less than the bump pitch. This reduces the distance the VDD and VSS signals must travel on the power rails before propagating to lower levels (M10, M9, . . . ) of the die.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A die, comprising:
   a first plurality of power tiles arranged in a first array and having a first voltage;
   a second plurality of power tiles arranged in a second array offset from the first array and having a second voltage;
   a first plurality of power mesh segments enclosed by the second plurality of power tiles and having the first voltage;
   a first power rail passing underneath the first plurality of power mesh segments and the first plurality of power tiles; and
   a first plurality of vias operatively connecting the first power rail with the first plurality of power mesh segments and the first plurality of power tiles.

2. The die of claim 1, further comprising:
   a second plurality of power mesh segments enclosed by the first plurality of power tiles and having the second voltage;
   a second power rail passing underneath the second plurality of power mesh segments and the second plurality of tiles; and
   a second plurality of vias operatively connecting the second power rail with the second plurality of power mesh segments and the second plurality of power tiles.

3. The die of claim 2, further comprising:
   a zipper structure operatively connected to the first plurality of power tiles and the second plurality of power tiles,
   wherein the first plurality of power tiles is located on a first side of the zipper structure, and
   wherein the second plurality of power tiles is located on a second side of the zipper structure.

4. The die of claim 3, wherein the zipper structure carries a clock signal.

5. The die of claim 3, further comprising:
   a full-dense-mesh (FDM) operatively connected to the zipper structure;
   a first bump having the first voltage, located on the second side of the zipper structure, and operatively connected to the first plurality of power tiles by the FDM and the zipper structure; and
   a second bump having the second voltage, located on the first side of the zipper structure, and operatively connected to the second plurality of power tiles by the zipper structure.

6. The die of claim 5, wherein the FDM is located in a M13 layer, wherein the first plurality of power tiles and the second plurality of power tiles are located in a M12 layer below the M13 layer, wherein the first plurality of power mesh segments and the second plurality of power mesh segments are located in the M12 layer below the M13 layer, and wherein the first power rail and the second power rail are located in a M11 layer below the M12 layer.

7. The die of claim 5, wherein the FDM comprises aluminum, and wherein the first plurality of power tiles and the second plurality of tiles comprise copper.

8. The die of claim 5, wherein the first bump and the second bump are separated by a bump pitch, wherein the first plurality of vias comprises a maximum inter-via distance, and wherein the maximum inter-via distance is less than the bump pitch.

9. The die of claim 5, further comprising:
   a third plurality of vias operatively connecting the FDM and the first plurality of mesh segments.

* * * * *

UNITED STATES PATENT AND TRADEMARK OFFICE
CERTIFICATE OF CORRECTION

PATENT NO. : 8,368,226 B2
APPLICATION NO. : 13/412513
DATED : February 5, 2013
INVENTOR(S) : Ramachandran et al.

It is certified that error appears in the above-identified patent and that said Letters Patent is hereby corrected as shown below:

In the Specifications:

In column 4, line 54, delete "$(VIAS_1)$" and insert -- $(VIAS_{11})$ --, therefor.

In column 4, line 60, delete "$(VIAS_1)$" and insert -- $(VIAS_{11})$ --, therefor.

Signed and Sealed this
Twenty-first Day of May, 2013

Teresa Stanek Rea
*Acting Director of the United States Patent and Trademark Office*